US008809482B2

(12) United States Patent
Fu et al.

(10) Patent No.: US 8,809,482 B2
(45) Date of Patent: *Aug. 19, 2014

(54) SILSESQUIOXANE RESINS

(75) Inventors: Peng-Fei Fu, Midland, MI (US); Eric Moyer, Midland, MI (US); Craig Yeakle, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/133,032

(22) PCT Filed: Oct. 19, 2009

(86) PCT No.: PCT/US2009/061125
§ 371 (c)(1),
(2), (4) Date: Jun. 6, 2011

(87) PCT Pub. No.: WO2010/068336
PCT Pub. Date: Jun. 17, 2010

(65) Prior Publication Data
US 2011/0233489 A1 Sep. 29, 2011

Related U.S. Application Data

(60) Provisional application No. 61/121,352, filed on Dec. 10, 2008.

(51) Int. Cl.
C08G 77/06 (2006.01)
(52) U.S. Cl.
USPC ................ 528/43; 528/25; 528/26; 528/31; 524/285; 524/360; 524/376
(58) Field of Classification Search
None
See application file for complete search history.

(56) References Cited

U.S. PATENT DOCUMENTS

| | | | |
|---|---|---|---|
| 4,587,138 A | 5/1986 | Yau et al. |
| 5,010,159 A | 4/1991 | Bank et al. |
| 5,100,503 A | 3/1992 | Allman et al. |
| 5,210,168 A | 5/1993 | Bergstrom et al. |
| 5,412,053 A | 5/1995 | Lichtenhan et al. |
| 5,422,223 A | 6/1995 | Sachdev et al. |
| 5,441,765 A | 8/1995 | Ballance et al. |
| 5,484,867 A | 1/1996 | Lichtenhan et al. |
| 5,589,562 A | 12/1996 | Lichtenhan et al. |
| 5,614,603 A | 3/1997 | Harkness et al. |
| 5,691,396 A | 11/1997 | Takemura et al. |
| 5,708,099 A | 1/1998 | Kushibiki et al. |
| 5,762,697 A | 6/1998 | Sakamoto et al. |
| 5,891,529 A | 4/1999 | Harkness et al. |
| 5,939,236 A | 8/1999 | Pavelchek et al. |
| 6,057,239 A | 5/2000 | Wang et al. |
| 6,087,064 A | 7/2000 | Lin et al. |
| 6,143,855 A | 11/2000 | Hacker et al. |
| 6,156,640 A | 12/2000 | Tsai et al. |
| 6,177,143 B1 | 1/2001 | Treadwell et al. |
| 6,268,457 B1 | 7/2001 | Kennedy et al. |
| 6,281,285 B1 | 8/2001 | Becker et al. |
| 6,329,118 B1 | 12/2001 | Hussein et al. |
| 6,340,734 B1 | 1/2002 | Lin et al. |
| 6,344,284 B1 | 2/2002 | Chou |
| 6,359,096 B1 | 3/2002 | Zhong et al. |
| 6,365,765 B1 | 4/2002 | Baldwin et al. |
| 6,368,400 B1 | 4/2002 | Baldwin et al. |
| 6,395,397 B2 | 5/2002 | Hong et al. |
| 6,420,084 B1 | 7/2002 | Angelopoulos et al. |
| 6,420,088 B1 | 7/2002 | Angelopoulos et al. |
| 6,424,039 B2 | 7/2002 | Wang et al. |
| 6,461,955 B1 | 10/2002 | Tsu et al. |
| 6,503,689 B2 | 1/2003 | Zampini et al. |
| 6,503,692 B2 | 1/2003 | Angelopoulos et al. |
| 6,506,497 B1 | 1/2003 | Kennedy et al. |
| 6,509,259 B1 | 1/2003 | Wang et al. |

(Continued)

FOREIGN PATENT DOCUMENTS

| | | |
|---|---|---|
| EP | 1197998 | 10/2001 |
| EP | 1197511 | 4/2002 |

(Continued)

OTHER PUBLICATIONS

Drylie, Ewan et al., Synthesis and Crystal Structures of Bromo- and Ester-Functionalised Polyhedral Silsesquioxanes, Polyhedron, Mar. 6, 2006, vol. 25, pp. 853-858.
Feher, Frank J. et al. A General Strategy for Synthesizing Cubeoctameric Silsesquioxanes Containing Polymerizable Functional Groups. Main Group Chemistry. May 1998, vol. 2, Issue 3, pp. 169-181, ISSN 1024-1221.
Xu, Hui et al., Synthesis and Characterization of Oligomeric Silsesquioxane with Pendent Carboxylic Acid Groups, European Polymer Journal, Dec. 2001, vol. 37, pp. 2397-2405.
Ito et al., Can. J. Chem. 73: 1924-1932 (1995).

(Continued)

Primary Examiner — Marc Zimmer
(74) Attorney, Agent, or Firm — Claude F. Purchase

(57) ABSTRACT

This invention pertains to silsesquioxane resins useful in anti-reflective coatings wherein the silsesquioxane resin comprises the units $(Ph(CH_2)_rSiO_{(3-x)/2}(OR')_x)_m$ $(HSiO_{(3-x)/2}(OR')_x)_n$ $(MeSiO_{(3-x)/2}(OR')_x)_o$ $(RSiO_{(3-x)/2}(OR')_x)_p$ $(R^1 SiO_{(3-x)/2}(OR')_x)_q$ where Ph is a phenyl group, Me is a methyl group; R' is hydrogen atom or a hydrocarbon group having from 1 to 4 carbon atoms; R is selected from a carboxylic acid group, a carboxylic acid forming group, and mixtures thereof; and $R^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of 0 to 0.90; n has a value of 0.05 to 0.99; o has a value of 0 to 0.95; p has a value of 0.01 to 0.5; q has a value of 0 to 0.5; and $m+n+o+p+q \approx 1$.

13 Claims, No Drawings

(56) References Cited

U.S. PATENT DOCUMENTS

| | | |
|---|---|---|
| 6,515,073 B2 | 2/2003 | Sakamoto et al. |
| 6,576,681 B2 | 6/2003 | Zampini et al. |
| 6,589,711 B1 | 7/2003 | Subramanian et al. |
| 6,589,862 B2 | 7/2003 | Wang et al. |
| 6,596,405 B2 | 7/2003 | Zampini et al. |
| 6,599,951 B2 | 7/2003 | Zampini et al. |
| 6,605,362 B2 | 8/2003 | Baldwin et al. |
| 6,610,457 B2 | 8/2003 | Kim et al. |
| 6,730,454 B2 | 5/2004 | Pfeiffer et al. |
| 6,746,530 B2 | 6/2004 | Wang |
| 6,824,879 B2 | 11/2004 | Baldwin et al. |
| 6,872,506 B2 | 3/2005 | Neef et al. |
| 6,924,346 B2 | 8/2005 | Boisvert et al. |
| 6,956,097 B2 | 10/2005 | Kennedy et al. |
| 6,969,753 B2 | 11/2005 | Baldwin et al. |
| 6,982,006 B1 | 1/2006 | Boyers et al. |
| 7,012,125 B2 | 3/2006 | Kennedy et al. |
| 7,202,013 B2 | 4/2007 | Ogihara et al. |
| 7,294,732 B2 | 11/2007 | Ohno et al. |
| 7,368,173 B2 | 5/2008 | Zhong et al. |
| 7,393,911 B2 | 7/2008 | Noda |
| 7,838,615 B2 | 11/2010 | Zhong |
| 2001/0036998 A1 | 11/2001 | Sakamoto et al. |
| 2002/0025495 A1 | 2/2002 | Ogata et al. |
| 2002/0042020 A1 | 4/2002 | Gallagher et al. |
| 2002/0055000 A1 | 5/2002 | Kennedy et al. |
| 2002/0065331 A1 | 5/2002 | Zampini et al. |
| 2002/0095018 A1 | 7/2002 | Baldwin et al. |
| 2002/0128388 A1 | 9/2002 | Kennedy et al. |
| 2002/0142586 A1 | 10/2002 | Shiota |
| 2002/0187422 A1 | 12/2002 | Angelopoulos et al. |
| 2002/0195419 A1 | 12/2002 | Pavelchek |
| 2002/0198269 A1 | 12/2002 | Zampini et al. |
| 2003/0022953 A1 | 1/2003 | Zampini et al. |
| 2003/0087102 A1 | 5/2003 | Yamaya et al. |
| 2003/0120018 A1 | 6/2003 | Baldwin et al. |
| 2003/0129531 A1 | 7/2003 | Oberlander et al. |
| 2003/0166828 A1 | 9/2003 | Cox et al. |
| 2003/0176614 A1 | 9/2003 | Hacker et al. |
| 2003/0199659 A1 | 10/2003 | Baldwin et al. |
| 2003/0209515 A1 | 11/2003 | Pavelchek |
| 2004/0210034 A1 | 10/2004 | Cox et al. |
| 2005/0245717 A1 | 11/2005 | Kennedy et al. |
| 2005/0282090 A1 | 12/2005 | Hirayama et al. |
| 2005/0288468 A1 | 12/2005 | Ohno et al. |
| 2006/0021964 A1 | 2/2006 | Hirayama et al. |
| 2006/0089478 A1 | 4/2006 | Noda |
| 2006/0269724 A1 | 11/2006 | Ohashi et al. |
| 2007/0022909 A1 | 2/2007 | Kennedy et al. |
| 2007/0025678 A1 | 2/2007 | Kushibiki et al. |
| 2007/0212886 A1* | 9/2007 | Uh et al. .................... 438/706 |
| 2007/0238300 A1 | 10/2007 | Ogihara et al. |
| 2007/0243488 A1 | 10/2007 | Tsunemori |
| 2007/0298349 A1 | 12/2007 | Zhang et al. |
| 2008/0014335 A1 | 1/2008 | Fu et al. |
| 2008/0026322 A1 | 1/2008 | Ogihara et al. |
| 2008/0241748 A1 | 10/2008 | Motallebi et al. |
| 2008/0318436 A1 | 12/2008 | Fu et al. |
| 2009/0280438 A1* | 11/2009 | Kohno et al. .................... 430/323 |
| 2009/0286179 A1 | 11/2009 | Takeshita |
| 2011/0236835 A1* | 9/2011 | Fu et al. .................... 430/315 |
| 2011/0236837 A1* | 9/2011 | Fu et al. .................... 430/324 |

FOREIGN PATENT DOCUMENTS

| | | |
|---|---|---|
| EP | 1788011 | 11/2006 |
| EP | 1586603 | 6/2007 |
| EP | 1867681 | 12/2008 |
| EP | 1845132 | 1/2009 |
| JP | 0656560 | 3/1994 |
| JP | 09221630 | 8/1997 |
| JP | 2002338690 | 11/2002 |
| JP | 2002356617 | 12/2002 |
| WO | 0077575 | 12/2000 |
| WO | 0206402 | 1/2002 |
| WO | 03044077 | 5/2003 |
| WO | 03044078 | 5/2003 |
| WO | 03044079 | 5/2003 |
| WO | 03044600 | 5/2003 |
| WO | 03089992 | 10/2003 |
| WO | 2004007192 | 1/2004 |
| WO | 2004044025 | 5/2004 |
| WO | 2004046224 | 6/2004 |
| WO | 2004051376 | 6/2004 |
| WO | 2004090965 | 10/2004 |
| WO | 2004113417 | 12/2004 |
| WO | 2005005235 | 1/2005 |
| WO | 2005034236 | 4/2005 |
| WO | 2005034677 | 4/2005 |
| WO | 2005035236 | 4/2005 |
| WO | 2006019468 | 2/2006 |
| WO | 2006065310 | 6/2006 |
| WO | 2006065316 | 6/2006 |
| WO | 2006065320 | 6/2006 |
| WO | 2006065321 | 6/2006 |
| WO | 2007066653 | 6/2007 |
| WO | 2007094848 | 8/2007 |
| WO | 2007094849 | 8/2007 |
| WO | WO 2008/038602 * | 4/2008 |
| WO | 2009088600 | 7/2009 |
| WO | 2009091440 | 7/2009 |
| WO | 2009111121 | 9/2009 |
| WO | 2009111122 | 9/2009 |
| WO | 2010068336 | 6/2010 |

OTHER PUBLICATIONS

J. Am. Chem. Soc. 1991, 113, 4303 by J. F. Cameron and J.M.J. Frechet.

J. Polym Sci 1999, 37, 4241by J.V. Crivello.

Kennedy et al., PROC of SPIE 5039: 144-151 (2003).

Kennedy et al., PROC of SPIE 5039:929-939 (2003).

King Industries Specialty Chemicals, K-Pure® High Performance Additives for Electronic Chemical Systems.

Polym. Eng. Sci 1992, 32, 1462 by J. V. Crivello.

Rahimian, Kamyar et al., Soluble, High Molecular Weight Polysilsesquioxanes with Carboxylate Functionalities, Macromolecules, Mar. 26, 2002, vol. 35, pp. 2452-2454.

Schiavone et al., SiON based antireflective coating for 193nm lithography, Part of the SPIE Conference on Advances in Resist Technology and Processing XVI, SPIE vol. 3678, Mar. 1999, 391-395.

Tsunooka et al., J. Photopolym. Sci. Technol., vol. 19, No. 1, 2006, pp. 65-71.

* cited by examiner

SILSESQUIOXANE RESINS

CROSS REFERENCE TO RELATED APPLICATIONS

This application is a U.S. national stage filing under 35 U.S.C. §371 of PCT Application No. PCT/US09/61125 filed on 19 Oct. 2009, which claims the benefit of U.S. Provisional Patent Application No. 61/121,352 filed 10 Dec. 2008 under 35 U.S.C. §119 (e). PCT Application No. PCT/US09/61125 and U.S. Provisional Patent Application No. 61/121,352 are hereby incorporated by reference.

BACKGROUND

In the photolithography process, exposure of a photoresist to UV light is an important step in attaining a high resolution image. With the continuing demand for smaller feature sizes in the semiconductor industry, 193 nm optical lithography has emerged very recently as the technology to produce devices with sub-100 nm features. The use of such a shorter wavelength of light requires the bottom antireflective coating (BARC) to reduce the reflection on substrate and dampen the photoresist swing cure by absorbing light that has passed though the photoresist. Commercially available antireflective coatings consist of both organic and inorganic based materials. Typically, the inorganic ARC, which exhibits good etch resistance, is CVD based and is subject to all the integration disadvantage of extreme topography; on the other hand, the organic ARC materials are applied by spin-on process and have excellent fill and planarization properties, but suffer from poor etch selectivity to organic photoresists. As a result, a material that offers the combined advantages of organic and inorganic ARC is highly desired.

In this regards, we have recently discovered that certain phenyl-hydride based silsesquioxane resins exhibit excellent anti-reflective coating properties for 193 nm light. Although Bottom Anti Reflective Coatings (BARC) materials can effectively reduce the reflection of activating radiation, removal of BARC materials without damaging the overlying photoresist and/or the underlying substrate has been very challenging. The typical process to remove BARC is by a plasma etch process. However, plasma etch often cause thinning of a photoresist layer. As a result, the patterns on the photoresist layer may be destroyed or becomes not transferable to the substrate layer. Plasma etch may also cause damage to the substrate thereby affecting the performance of the final device. What is more, the additional etch step for removing the BARC material increases cost and process complication in photolithographic practice. Therefore it is desirable to have an antireflective coating material that may be removed by means other than plasma etch.

This invention pertains to silsesquioxane resins useful as an antireflective coating layer for photolithography. This invention more specifically pertains to a silsesquioxane material containing carboxy moiety. The carboxy functional silsesquioxane resins form excellent spin-on film and are resistant to organic solvents such as PGMEA, 2-heptonene, but are developer-soluble when cured at 250° C. or below. In addition Si-rich ARCs produced from the carboxyl function silsesquioxane resins show excellent dry-etch resistance.

BRIEF SUMMARY

This invention pertains to carboxyl functional silsesquioxane resins useful in antireflective coatings wherein the silsesquioxane resin is comprised of the units

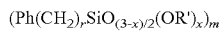

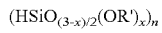

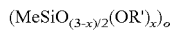

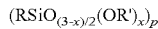

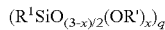

where Ph is a phenyl group, Me is a methyl group; R' is hydrogen atom or a hydrocarbon group having from 1 to 4 carbon atoms; R is selected from a carboxylic acid group, a carboxylic acid forming group or mixtures thereof; and $R^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0 to 0.95; p has a value of 0.05 to 0.5; q has a value of 0 to 0.95; and m+n+o+p+q≈1. When these resins are used in antireflective coatings, the cured films exhibit excellent solvent resistance (i.e. PGMEA) and can be removed by a variety of means including etching, wet developing, wet stripping and others.

DETAILED DESCRIPTION

The silsesquioxane resins useful in forming the antireflective coating are comprised of the units

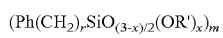

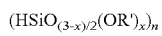

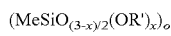

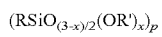

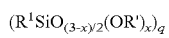

where Ph is a phenyl group, Me is a methyl group; R' is hydrogen atom or a hydrocarbon group having from 1 to 4 carbon atoms; R is selected from a carboxylic acid group, a carboxylic acid forming group or mixtures thereof; and $R^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of 0 to 0.90; n has a value of 0.05 to 0.99; o has a value of 0 to 0.95; p has a value of 0.01 to 0.5; q has a value of 0 to 0.5; and m+n+o+p+q 1. Typically m has a value of 0.05 to 0.25, alternatively 0.05 to 0.15. Typically n has a value of 0.15 to 0.80, alternatively 0.2 to 0.75. Typically o has a value of 0.25 to 0.80, alternatively 0.4 to 0.75. Typically p has a value of 0.015 to 0.35, alternatively 0.025 to 0.25. Typically q has a value of 0 to 0.15, alternatively 0 to 0.1.

R' is independently a hydrogen atom or hydrocarbon group having 1 to 4 carbon atoms. R' may be exemplified by H, methyl, ethyl, propyl, iso-propyl and butyl.

In the resin R is a carboxylic acid group, a carboxylic acid forming group or mixtures thereof. Examples of carboxylic acid groups are those of the general formula —$R^2C(O)OH$ where $R^2$ is selected from alkylene groups having 1-10 carbon atoms. Examples of carboxylic acid forming groups are those of the general formula —$R^2C(O)OR^3$ where $R^2$ is selected from alkylene groups having 1-10 carbon atoms, and $R^3$ is a protecting group. Protecting groups are organic or silyl groups that cleave under acidic conditions to yield the corresponding carboxylic acid group. Protecting groups may be exemplified, but not limited, by t-butyl, trimethylsilyl, anhydride groups, methylthiomethyl ester, benzyloxymethyl ester, diphenylmethyl ester, p-methoxybenzyl ester, and others. Many of the protecting groups are described in "Protective groups in organic synthesis" by Greene and Wuts, $3^{rd}$ Edition, page 369-453.

$R^1$ is selected from substituted phenyl groups, ester groups, polyether groups; mercapto groups, sulfur-containing organic functional groups, hydroxyl producing group, aryl sulphonic ester groups, and reactive or curable organic functional groups. Substituted phenyl groups contain at least one HO—, MeO—, Me—, Et- Cl— and/or other substituents. Ester groups may be any organic substituent containing at least one ester functionality. Examples of ester groups useful herein are —$(CH_2)_2$—O—C(O)Me and —$(CH_2)_2$—C(O)—OMe. Polyether groups are an organic substituent having hydrocarbon units linked through oxygen atom, represented, but not limited, by the following structure: —$(CH_2)_a$[O $(CH_2)_b]_c OR^4$, wherein a=2 to 12; b=2 to 6; c=2 to 200; $R^4$=H, alkyl, or other organic groups. Examples of polyether groups useful herein are —$(CH_2)_3$—$(OCH_2CH_2)_c$—OMe, —$(CH_2)_3$—$(OCH_2CH_2)_c$—OH and —$(CH_2)_3$—$(OCH_2CH_2)_7$—OAc and —$(CH_2)_3$—$(OCH_2CH_2)_c$—OC(O)Me. Mercapto groups have the general formula $HS(CH_2)_d$— where d has a value of 1-18, such as mercaptopropyl, mercaptoethyl, and mercaptomethyl. Aryl sulfonic ester groups have the formula $R^5$O—$SO_2$—Ph—$(CH_2)$r- where $R^5$ is a hydrogen atom, an aliphatic group or an aromatic group and r has a value of 0, 1, 2, 3, or 4. Aryl sulfonic ester groups may be exemplified by, but not limited to HO—$SO_2$—Ph—$(CH_2)$r- or $(CH_3)_2$CHO—$SO_2$—Ph—$(CH_2)$r-. Reactive or curable organic functional groups may be exemplified by, but not limited to alkenyl groups such at vinyl and allyl; epoxy groups such as glycidoxypropyl group and epoxycyclohexane group, acrylate groups such as methacryoxypropyl groups, acryloxypropyl, and others.

The typical method for producing the silsesquioxane resin involves the hydrolysis and condensation of the appropriate halo or alkoxy silanes. One example is the hydrolysis and condensation of a mixture of phenyltrichlorsilane, trichlorosilane, a silane having a carboxylic acid or carboxylic acid forming group, methyltrichlorosilane and optionally other organofunctional trichlorosilanes. By this method it is possible that residual —OH and/or —OR' will remain in the silsesquioxane resin as a result of incomplete hydrolysis or condensation. If the total amount of units in the silsesquioxane resin containing —OR' groups, exceed 40 mole % then gellation and instability of the resin may occur. Typically the silsesquioxane resin contains 6 to 38 mole % of units containing —OR' groups, alternatively less than 5 mole %, alternatively less than 1 mole %.

The silsesquioxane resin has a weight average molecular weight (Mw) in the range of 500 to 200,000 alternatively in the range of 500 to 100,000, alternatively in the range of 700 to 30,0000 as determined by gel permeation chromatography employing RI detection and polystyrene standards.

The method for preparing a siloxane resin comprises reacting in an organic solvent (A) a mixture of silane reactants comprising $HSiX_3$, and $RSiX_3$, and optionally $MeSiX_3$, $Ph(CH_2)_rSiX_3$, and $R^1SiX_3$ with (B) water, where X is a hydrolyzable group independently selected from Cl, Br, $CH_3CO_2$—, an alkoxy group —OR', or other hydrolyzable groups. The silanes useful herein can be exemplified by, but not limited to, $HSi(OEt)_3$, $HSiCl_3$, $PhCH_2CH_2SiCl_3$, and $PhSiCl_3$, $MeSi(OMe)_3$, $MeSiCl_3$, $R^1SiCl_3$ and $R^1Si(OMe_3)_3$ where $R^1$ is as defined above, Me represents a methyl group, Et represents an ethyl group and Ph represents a phenyl group. In the reaction mixture there is typically 0 to 90 mole %, alternatively 5 to 25 mole % $Ph(CH_2)_rSiX_3$, 5 to 99 mole %, alternatively 15 to 80 mole % $HSiX_3$, 0 to 95 mole %, alternatively 25 to 80 mole % $MeSiX_3$, 1 to 95 mole %, alternatively 1.5 to 35 mole % $RSiX_3$, and 0 to 50 mole %, alternatively 0 to 15 mole % $R^1 SiX_3$ with the proviso that the sum of reactants equals 100 mole %.

Carboxy functional silanes that may be used in the preparation of the silsesquioxane resin, may be exemplified by, but not limited to,

$(MeO)_3Si$—$(CH_2)_2$—COO$^t$Bu

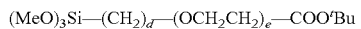
$(MeO)_3Si$—$(CH_2)_d$—$(OCH_2CH_2)_e$—COO$^t$Bu

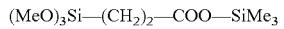
$(MeO)_3Si$—$(CH_2)_2$—COO—$SiMe_3$

$(MeO)_3Si$—$(CH_2)_d$—$(OCH_2CH_2)_e$—COO—$SiMe_3$

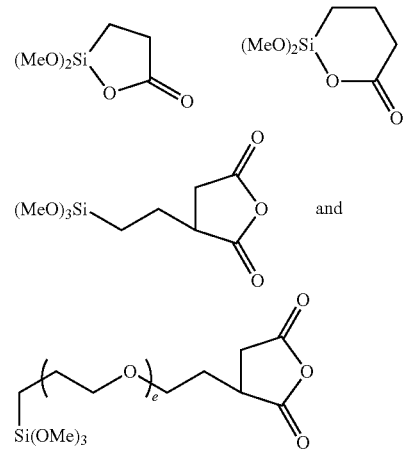

wherein Me is a methyl group, $^t$Bu is a t-butyl group, m has a value of 2 or 3 and n has a value of 1 to 10.

The amount of water in the reaction is typically in the range of 0.5 to 2 moles water per mole of X groups in the silane reactants, alternatively 0.5 to 1.5 moles per mole of X groups in the silane reactants.

The time to form the silsesquioxane resin is dependent upon a number of factors such as the temperature, the type and amount of silane reactants, and the amount of catalyst, if present. It is preferred to carry out the reaction for a time sufficient for essentially all of the X groups to undergo hydrolysis reactions. Typically the reaction time is from minutes to hours, alternatively 10 minutes to 1 hour. The reaction to produce the silsesquioxane resin can be carried out at any temperature so long as it does not cause significant gellation or cause curing of the silsesquioxane resin. The temperature at which the reaction is carried out is typically in the range of 25° C. up to the reflux temperature of the reaction mixture. Typically the reaction is carried out by heating under reflux for 10 minutes to 1 hour.

The reaction step comprises both hydrolyzing and condensing the silane components. To facilitate the completion of the reaction a catalyst may be used. The catalyst can be a base or an acid such as a mineral acid. Useful mineral acids include, but are not limited to, HCl, HF, HBr, $HNO_3$, and $H_2SO_4$, among others, typically HCl. The benefit of HCl or other volatile acids is that a volatile acid can be easily removed from the composition by stripping after the reaction is completed. The amount of catalyst may depend on its nature. The amount of catalyst is typically 0.05 wt % to 1 wt % based on the weight of (A)+(B).

Generally, the silane reactants are either not soluble in water or sparingly soluble in water. In light of this, the reaction is carried out in an organic solvent. The organic solvent is present in any amount sufficient to dissolve the silane reactants. Typically the organic solvent is present from 1 to 99 weight percent, alternatively 70 to 90 wt % based on the weight of (A)+(B). Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol diethyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as propylene glycol monomethyl ether acetate (PGMEA), isobutyl isobutyrate and propyl propronate. Useful silicone solvents may be exemplified by, but not limited to cyclic siloxanes such as octamethylcyclotetrasiloxane, and decamethylcyclopentasiloxane. A single solvent may be used or a mixture of solvents may be used.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilanes routes) and solvents. Methods for removing volatiles are known in the art and include, for example, distillation or stripping under reduced pressure.

Following completion of the reaction the catalyst may be optionally removed. Methods for removing the catalyst are well know in the art and would include neutralization, stripping or water washing or combinations thereof. The catalyst may negatively impact the shelf life of the silsesquioxane resin especially when in solution thus its removal is suggested.

To increase the molecular weight of the silsesquioxane resin and/or to improve the storage stability of the silsesquioxane resin the reaction may be carried out for an extended period of time with heating from 40° C. up to the reflux temperature of the solvent ("bodying step"). The bodying step may be carried out subsequent to the reaction step or as part of the reaction step. Typically, the bodying step is carried out for a period of time in the range of 10 minutes to 6 hours, alternatively 20 minutes to 3 hours.

Following the reaction to produce the silsesquioxane resin a number of optional steps may be carried out to obtain the silsesquioxane resin in the desired form. For example, the silsesquioxane resin may be recovered in solid form by removing the solvent. The method of solvent removal is not critical and numerous methods are well known in the art (e.g. distillation under heat and/or vacuum). Once the silsesquioxane resin is recovered in a solid form, the resin can be optionally re-dissolved in the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

Another method for producing the silsesquioxane resin comprises grafting the corresponding carboxy containing monomer onto a starting silsesquioxane resin. The typical method for grafting the corresponding carboxy containing monomer onto the starting silsesquioxane resin is by the hydrosilylation of a carboxy containing olefin onto a Si—H containing silsesquioxane resin in the presence of a transition metal catalyst.

Carboxy containing olefins useful herein include organic molecules that contain a double bond and a carboxy containing group, —C(O)OR$^3$ where R$^3$ is as described above. The carboxy containing group may be exemplified by carboxylic acid (R$^3$=H), a carboxylic anhydride or a carboxylic ester. When the carboxylate group is a carboxylic ester group, it has a protected organic group, which may be cleaved under the reaction conditions to yield the corresponding carboxylic acid.

Carboxy containing olefins useful herein include, but are not limited to,

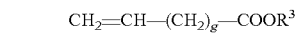

where R$^3$ can be $^t$Bu, SiMe$_3$, Si$^t$BuMe$_2$, or CPh$_3$; and g=0 to 8;

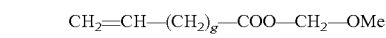

where m=0 to 8;

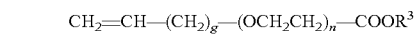

where R can be $^t$Bu, SiMe$_3$, Si$^t$BuMe$_2$, or CPh$_3$; g=0 to 8; h=1 to 10.

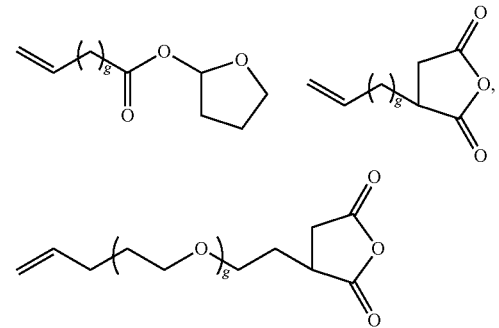

SiH containing silsesquioxane resins useful in the production of the silsesquioxane resins herein are comprised of the units

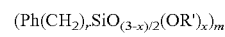

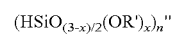

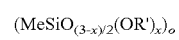

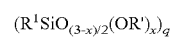

where Ph is a phenyl group, Me is a methyl group; R' is hydrogen atom or a hydrocarbon group having from 1 to 4 carbon atoms; and R$^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of 0 to 0.90; n" has a value of 0.10 to 1; o has a value of 0 to 0.95; q has a value of 0 to 0.5; and m+n"+o+q≈1.

Typically m has a value of 0.05 to 0.25, alternatively 0.5 to 0.15. Typically n" has a value of 0.165 to 0.95, alternatively 0.10 to 0.3. Typically o has a value of 0.25 to 0.80, alternatively 0.25 to 0.75. Typically q has a value of 0 to 0.15, alternatively 0 to 0.1.

The carboxylate olefin and Si—H containing silsesquioxane resin are reacted in the presence of a transition metal catalyst. Useful transition metal catalysts may be selected from a variety of hydrosilylation catalysts known to promote the reaction of vinyl-functional radicals with silicon-bonded hydrogen atoms. Suitable transition metal catalyst may include platinum and rhodium-containing compounds and complexes. Platinum catalysts such as platinum acetylacetonate or chloroplatinic acid are representative of these compounds and suitable for use. A typical transition metal catalyst is a chloroplatinic acid complex of divinyltetramethyldisilxoane diluted in dimethylvinylsiloxy endblocked polydimethylsiloxane.

The amount of carboxylate olefin to Si—H containing silsesquioxane resin is typically such that the final resin contains 5 to 99 mole % of $(HSiO_{(3-x)/2}(OR')_x)$ and 1 to 50 mole % of $(RSiO_{(3-x)/2}(OR')_x)$, alternatively 15 to 80 mole % of $(HSiO_{(3-x)/2}(OR')_x)$ and 1.5 to 35 mole % of $(RSiO_{(3-x)/2}(OR')_x)$, alternatively 20 to 75 mole % of $(HSiO_{(3-x)/2}(OR')_x)$ and 2.5 to 25 mole % of $(RSiO_{(3-x)/2}(OR')_x)$. The amount of transition metal catalyst used is typically present in an amount to provide 2 ppm, alternatively 5 to 200 ppm of transition metal (i.e. Pt) based on the total weight carboxylate olefin and Si—H containing silsesquioxane.

This invention also pertains to an antireflective coating (ARC) composition comprising
(i) silsesquioxane resin comprised of the units

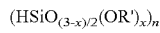

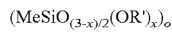

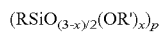

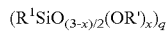

where Ph is a phenyl group, Me is a methyl group; R' is hydrogen atom or a hydrocarbon group having from 1 to 4 carbon atoms; R is selected from a carboxylic acid group, a carboxylic acid forming group or mixtures thereof; and $R^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of >0 to 0.90; n has a value of 0.05 to 0.99; o has a value of 0 to 0.95; p has a value of 0.01 to 0.5; q has a value of 0 to 0.5; and m+n+o+p+q≈1; and
(ii) a solvent.

Useful solvents (ii) include, but are not limited to, 1-methoxy-2-propanol, propylene glycol monomethyl ethyl acetate gamma-butyrolactone, and cyclohexanone, among others. The ARC composition typically comprises from 10% to 99.9 wt % solvent based on the total weight of the ARC composition, alternatively 80 to 95 wt %.

The antireflective coating compositions are formed by mixing together the silsesquioxane resin and solvent, and optionally any other additive.

EXAMPLES

The following examples are included to demonstrate embodiments of the invention. It should be appreciated by those of skill in the art that the techniques disclosed in the examples which follow represent techniques discovered by the inventor to function well in the practice of the invention. However, those of skill in the art should, in light of the present disclosure, appreciate that many changes can be made in the specific embodiments which are disclosed and still obtain a like or similar result without departing from the spirit and scope of the invention. All percentages are in wt. %. Structures given in Examples 1-6 are theoretical structures based on the reactants.

Example 1

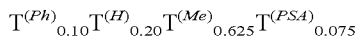

A reactor was loaded with 445.1 g of propylene glycol methyl ether acetate (PGMEA), 30.89 g of 3-(triethoxysilyl) propyl succinic anhydride (0.101 mol), 28.62 g of phenyltrichlorosilane (0.135 mol), 126.40 g of methyltrichlorosilane (0.846 mol), and 36.65 g of trichlorosilane (0.271 mol). The jacket temperature was set at 25° C. The solution was vigorously stirred. To a flask was placed 1080 g of PGMEA and 54.1 g deionized water. The mixture of PGMEA and water was vigorously stirred until all the water dissolved in PGMEA. Next, the PGMEA/water solution was added to the reactor under nitrogen over 1 hour while the reactants were vigorously stirred. After the completion of addition, the mixture in the reactor was washed three times with DI water (2×571 g). The solution was then stripped after adding 120 g of Ethanol (EtOH) to give a clear PGMEA solution. The solution is diluted to 10 Wt. % by adding more PGMEA and then filtrated through a 0.2 mm Teflon filter. GPC (vs. polystyrene): Mw=11300, Mw/Mn=2.70.

Example 2

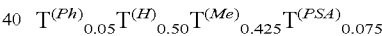

In a reactor was loaded with 672.5 g of propylene glycol methyl ether acetate (PGMEA), 11.42 g of 3-(triethoxysilyl) propyl succinic anhydride (0.038 mol), 15.87 g of phenyltrichlorosilane (0.075 mol), 95.29 g of methyltrichlorosilane (0.638 mol), and 101.59 g of trichlorosilane (0.750 mol). The jacket temperature was set at 25° C. The solution was vigorously stirred. To a flask was placed 1080 g of PGMEA and 59.4 g deionized water. The mixture of PGMEA and water was vigorously stirred until all the water dissolved in PGMEA. Next, the PGMEA/water solution was added to the reactor under nitrogen over 1 hour while the reactants were vigorously stirred. After the completion of addition, the mixture in the reactor was washed three times with DI water (2×500 g). The solution was then stripped after adding EtOH (120 g) to give a clear PGMEA solution. The solution is diluted to 10 Wt.% by adding more PGMEA and then filtrated through a 0.2 mm Teflon filter. GPC (vs. polystyrene): Mw=44300, Mw/Mn=5.99.

Eample 3

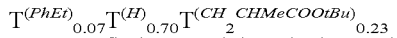

To a flask containing hydrogensilsesquioxane resin (Mn=2200, 37.10 g, 0.7 mol) in 200 mL of toluene, were added styrene (7.29 g, 0.07 mol) and t-butyl methacrylate (32.71 g, 0.23 mol), followed by a platinum catalyst. The mixture was stirred and irradiated with UV lamp at room temperature. After 18 hrs, the volatiles were removed at 40° C. to yield the titled resin as viscous oil. The resin was dissolved in PGMEA to give 10 wt. % solution and the solution was filtrated through a 0.2 mm Teflon filter. GPC (vs. polystyrene): Mw=4890, Mw/Mn=2.44;

Example 4

$$T^{(PhEt)}_{0.07}T^{(H)}_{0.74}T^{[(CH_2)_3COOtBu)]}_{0.19}$$

To a flask containing hydrogensilsesquioxane resin (Mn=2200, 26.5 g, 0.5 mol) in 200 mL of toluene, were added styrene (3.65 g, 0.035 mol) and t-butyl butenoate (17.0 g, 0.115 mol), followed by a platinum catalyst. The mixture was stirred and refluxed overnight. The volatiles were then removed at 40° C. to yield a viscous oil. The oil was dissolved in PGMEA to give 10 wt. % solution and the solution was filtrated through a 0.2 mm Teflon filter. GPC (vs. polystyrene): Mw=5730, Mw/Mn=2.21;

Example 5

$$T^{(PhEt)}_{0.07}T^{(H)}_{0.70}T^{[(CH_2)_3COOtBu]}_{0.23}$$

To a flask containing hydrogensilsesquioxane resin (Mn=11,800, 20 g, 0.38 mol) in 100 mL of toluene, were added styrene (3.65 g, 0.035 mol) and t-butyl butenoate (14.22 g, 0.095 mol), followed by a platinum catalyst. The rotary vapor at 40° C. to yield viscous oil. The oil was dissolved in PGMEA to give 10 wt. % solution and the solution was filtrated through a 0.2 mm Teflon filter. GPC (vs. polystyrene): Mw=15,300, Mw/Mn=2.78.

Example 6

$$T^{(Ph)}_{0.1}T^{(H)}_{0.2}T^{(Me)}_{0.6}T^{((CH_2)_3COOtBu)}_{0.1}$$

To a flask containing T(Ph)$_{0.1}$T(H)$_{0.3}$T(Me)$_{0.6}$ resin (20 g, 0.38 mol) in 100 mL of toluene, were added t-butyl butenoate (3.26 g, 0.022 mol), followed by a platinum catalyst. The mixture was stirred and refluxed overnight. The volatiles were then removed using rotary vapor at 40° C. to yield white solid. The resin was dissolved in PGMEA to give 10 wt. % solution and the solution was filtrated through a 0.2 mm Teflon filter. GPC (vs. polystyrene): Mw=12,450, Mw/Mn=2.95.

Example 7

$$T^{(Ph)}_{0.07}T^{(H)}_{0.45}T^{(Me)}_{0.36}T^{((CH_2)_3COOtBu)}_{0.12}$$

PGMEA (600 g), phenyltrimethoxysilane (13.9 g, 0.07 mol), triethoxysilane (73.9 g. 0.45 mol), methyltriethoxysialne (64.2 g, 0.36 mol), (3-tert-butyl)propal trimethoxysialne (31.7 g, 0.12 mol), and de-ionized water (54 g, 3 mol) were loaded into a flask. The solution was stirred for 5 min at room temperature and followed by the addition of nitric acid (70%, 0.64 g). The mixture was stirred overnight at 80° C. and then refluxed for 4 hrs, whereby low boiling volatiles were condensed and removed. The solution was cooled to room temperature to yield a clear colorless solution. The solution is then washed with de-ionized water. The residual water was stripped along with some PGMEA. The solution is diluted with PGMEA to a 10% solution in PGMEA. GPC (vs. PS): M$_w$=6300; M$_w$/M$_n$=2.58.

Example 8

$$T^{(Ph)}_{0.07}T^{(H)}_{0.45}T^{(Me)}_{0.36}T^{((CH_2)_3COOtBu)}_{0.12}$$

PGMEA (600 g), phenyltrimethoxysilane (19.8 g, 0.10 mol), triethoxysilane (32.8 g. 0.20 mol), methyltriethoxysialne (111.4 g, 0.625 mol), (3-tert-butyl)propal trimethoxysialne (19.8 g, 0.075 mol), and de-ionized water (54 g, 3 mol) were loaded into a flask. The solution was stirred for 5 min at room temperature and followed by the addition of nitric acid (70%, 0.64 g). The mixture was stirred overnight at 80° C. and then refluxed for 4 hrs, whereby low boiling volatiles were removed. The solution was cooled to room temperature to yield a clear colorless solution. The solution is then washed with de-ionized water. The residual water was stripped along with some PGMEA. The solution is diluted with PGMEA to a 10% solution in PGMEA. GPC (vs. PS): M$_w$=5300; M$_w$/M$_{w/Mn}$=2.45.

The invention claimed is:

1. A silsesquioxane resin wherein the silsesquioxane resin comprises the units $(Ph(CH_2)_rSiO_{(3-x)/2}(OR')_x)_m$ $(HSiO_{(3-x)/2}(OR')_x)_n$ $(MeSiO_{(3-x)/2}(OR')_x)_o$ $(RSiO_{(3-x)/2}(OR')_x)_p$ $(R^1SiO_{(3-x)/2}(OR')_x)_q$ where Ph is a phenyl group, Me is a methyl group; R' is hydrogen atom or a hydrocarbon group having from 1 to 4 carbon atoms; R is selected from a carboxylic acid group, a protected carboxylic acid group wherein the protecting group is selected from t-butyl, trimethylsilyl, anhydride groups, methylthiomethyl ester, benzyloxymethyl ester, diphenylmethyl ester, and p-methoxybenzyl ester, and mixtures thereof; and R$^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of 0.05 to 0.25; n has a value of 0.15 to 0.80; o has a value of 0 to 0.95; p has a value of 0.015 to 0.35; q has a value of 0 to 0.5; and m+n+o+p+q≈1.

2. The resin as claimed in claim 1 wherein o has a value of 0.25 to 0.80, and q has a value of 0 to 0.15.

3. The resin as claimed in claim 1 wherein R' is H.

4. The resin as claimed in claim 1 wherein R is a carboxylic acid group having the formula —R$^2$C(O)OH, a protected carboxylic acid group having the formula —R$^2$C(O)OR$^3$, or a mixture thereof, where R$^2$ is selected from alkylene groups having 1-10 carbon atoms and R$^3$ is the protecting group.

5. A method for producing a silsesquioxane resin comprising reacting in an organic solvent (A) a mixture of silane reactants comprising 5 to 25 mole % Ph(CH$_2$)$_r$SiX$_3$, 15 to 80 mole % HSiX$_3$ 0 to 95 mole % MeSiX$_3$, 15 to 35 mole % RSiX$_3$, and 0 to 50 mole % R$^1$SiX$_3$ with the proviso that the sum of silane reactants equals 100 mole %;
and (B) 0.5 to 2 moles of water per mole of X in the silane reactants wherein Ph represents a phenyl group, Me represents a methyl group, R is selected from a carboxylic acid group, a protected carboxylic acid group wherein the protecting group is selected from t-butyl, trimethylsilyl, anhydride groups, methylthiomethyl ester, benzyloxymethyl ester, diphenylmethyl ester, and p-methoxybenzyl ester and a mixture thereof; and R$^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; and X is a hydrolyzable group, further optionally comprising adding (C) 0.05 to 1 wt % of a catalyst based on the weight of (A)+(B).

6. The method as claimed in claim 5 wherein $RSiX_3$ is selected from

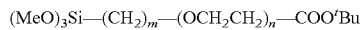

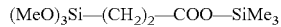

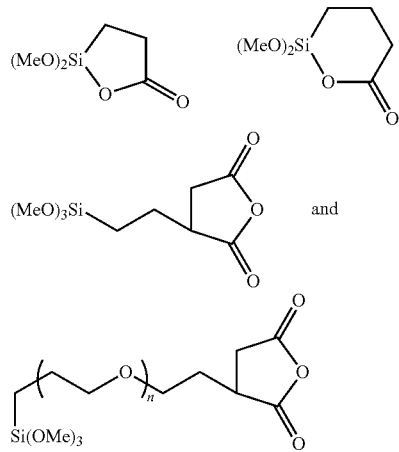

wherein Me is a methyl group, $^tBu$ is a t-butyl group, m has a value of 2 or 3 and n has a value of 1 to 10.

7. The method as claimed in claim 5 wherein the organic solvent is present in an amount of 1 to 99 wt % based on the weight of (A)+(B).

8. The method as claimed in claim 7 wherein the organic solvent is selected from saturated aliphatics, cycloaliphatics, aromatics, ethers, ketones, halogen substituted alkanes, halogenated aromatics, esters and silicones.

9. A method for producing a silsesquioxane resin comprising grafting a carboxylate olefin onto a Si—H containing silsesquioxane resin in the presence of a transition metal catalyst, wherein the carboxylate olefin is selected from

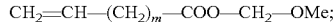

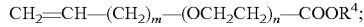

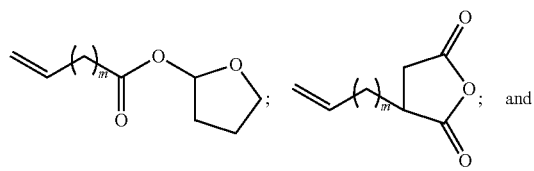

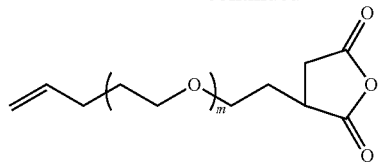

where $R^4$ is selected from Bu, $SiMe_3$, $Si^tBuMe_2$, or $CPh_3$; and m=0 to 8, and the SiH containing silsesquioxane resin comprises the units

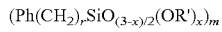

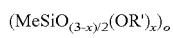

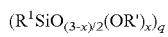

where Ph is a phenyl group, Me is a methyl group; R' is hydrogen atom or a hydrocarbon group having from 1 to 4 carbon atoms; and $R^1$ is selected from substituted phenyl groups, ester groups, polyether groups, mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of 0.05 to 0.25; n" has a value of 0.165 to 0.95; o has a value of 0 to 0.95; q has a value of 0 to 0.5; and m+n"+o+q≈1.

10. The method as claimed in claim 9 wherein the transition metal catalyst is a platinum catalyst.

11. An antireflective coating (ARC) composition comprising (i) silsesquioxane resin comprising the units

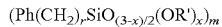

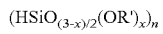

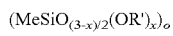

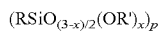

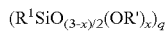

where Ph is a phenyl group, Me is a methyl group; R' is hydrogen atom or a hydrocarbon group having from 1 to 4 carbon atoms; R is selected from a carboxylic acid group, a protected carboxylic acid group wherein the protecting group is selected from t-butyl, trimethylsilyl, anhydride groups, methylthiomethyl ester, benzyloxymethyl ester, diphenylmethyl ester, and p-methoxybenzyl ester, and mixtures thereof; and $R^1$ is selected from substituted phenyl groups, ester groups, polyether groups; mercapto groups, sulfur-containing organic functional groups, hydroxyl producing group, aryl sulphonic ester groups, and reactive or curable organic functional groups; and r has a value of 0, 1, 2, 3, or 4; x has a value of 0, 1 or 2; wherein in the resin m has a value of 0.05 to 0.25; n has a value of 0.15 to 0.80; o has a value of 0 to 0.95; p has a value of 0.015 to 0.35; q has a value of 0 to 0.5; and m+n+o+p+q≈1; and (ii) a solvent.

12. The ARC composition as claimed in claim 11 wherein there is 10% to 99.9 wt % solvent based on the total weight of the ARC composition.

13. The ARC composition as claimed in claim 11 wherein the solvent is selected from 1-methoxy-2-propanol, propylene glycol monomethyl ethyl acetate gamma-butyrolactone, and cyclohexanone.

* * * * *